(12) United States Patent
Li et al.

(10) Patent No.: US 9,507,259 B2
(45) Date of Patent: Nov. 29, 2016

(54) PHOTORESIST COMPOSITION

(75) Inventors: Mingqi Li, Shrewsbury, MA (US);
Emad Aqad, Northborough, MA (US);
Cong Liu, Shrewsbury, MA (US);
Ching-Lung Chen, Miaoli (TW);
Shintaro Yamada, Shrewsbury, MA (US); Cheng-bai Xu, Southborough, MA (US); Joseph Mattia, Framingham, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 81 days.

(21) Appl. No.: 13/482,595

(22) Filed: May 29, 2012

(65) Prior Publication Data
US 2013/0137038 A1    May 30, 2013

Related U.S. Application Data

(60) Provisional application No. 61/490,874, filed on May 27, 2011.

(51) Int. Cl.
*G03F 7/004* (2006.01)
*G03F 7/039* (2006.01)

(52) U.S. Cl.
CPC ............. *G03F 7/004* (2013.01); *G03F 7/0045* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 6,908,722 B2 | 6/2005 | Ebata et al. | |
| 7,262,321 B2 | 8/2007 | Harada et al. | |
| 7,301,047 B2 | 11/2007 | Yoshida et al. | |
| 7,304,175 B2 | 12/2007 | Harada et al. | |
| 7,569,324 B2 | 8/2009 | Kobayashi et al. | |
| 2003/0134227 A1* | 7/2003 | Cameron et al. | 430/270.1 |
| 2006/0141383 A1* | 6/2006 | Miyamatsu et al. | 430/270.1 |
| 2007/0100158 A1* | 5/2007 | Harada et al. | 560/149 |
| 2008/0138742 A1 | 6/2008 | Kodama et al. | |
| 2008/0182203 A1* | 7/2008 | Yun et al. | 430/281.1 |
| 2009/0068591 A1* | 3/2009 | Kawaue et al. | 430/285.1 |
| 2009/0246695 A1* | 10/2009 | Yamaguchi et al. | 430/286.1 |
| 2011/0091820 A1* | 4/2011 | Hata et al. | 430/325 |
| 2011/0250537 A1* | 10/2011 | Aqad et al. | 430/270.1 |
| 2012/0015302 A1 | 1/2012 | Tango et al. | |
| 2012/0077131 A1 | 3/2012 | Enomoto et al. | |

FOREIGN PATENT DOCUMENTS

| | | | |
|---|---|---|---|
| CN | 101408728 A | | 4/2009 |
| JP | 2009186952 A | | 8/2009 |
| JP | 201 0061 01 | * | 3/2010 |
| JP | 2011085670 A | | 4/2011 |
| JP | 20120122032 A1 | | 5/2012 |
| JP | 2012242657 A | | 12/2012 |
| WO | WO 2009154114 A1 | * | 12/2009 |
| WO | WO 2010140709 A1 | * | 12/2010 |
| WO | 2011104127 A1 | | 9/2011 |

OTHER PUBLICATIONS

Machine translation JP 2010-061018. Mar. 18, 2010.*
English Abstract of Japanese Patent No. 2010256842A; Date of Publication Nov. 11, 2010; 2 pages.

* cited by examiner

*Primary Examiner* — Cynthia H Kelly
*Assistant Examiner* — Alyssa L Cepluch
(74) *Attorney, Agent, or Firm* — Cantor Colburn LLP

(57) ABSTRACT

A photoresist composition comprises an acid-sensitive polymer, and a cyclic sulfonium compound having the formula:

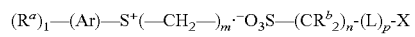

$(R^a)_l-(Ar)-S^+-(CH_2-)_m{}^-O_3S-(CR^b{}_2)_n-(L)_p-X$ wherein each $R^a$ is independently a substituted or unsubstituted $C_{1-30}$ alkyl group, $C_{6-30}$ aryl group, $C_{7-30}$ aralkyl group, or combination comprising at least one of the foregoing, Ar is a monocyclic, polycyclic, or fused polycyclic $C_{6-30}$ aryl group, each $R^b$ is independently H, F, a linear or branched $C_{1-10}$ fluoroalkyl or a linear or branched heteroatom-containing $C_{1-10}$ fluoroalkyl, L is a $C_{1-30}$ linking group optionally comprising a heteroatom comprising O, S, N, F, or a combination comprising at least one of the foregoing heteroatoms, X is a substituted or unsubstituted, $C_5$ or greater monocyclic, polycyclic or fused polycyclic cycloaliphatic group, optionally comprising a heteroatom comprising O, S, N, F, or a combination comprising at least one of the foregoing, and l is an integer of 0 to 4, m is an integer of 3 to 20, n is an integer of 0 to 4, and p is an integer of 0 to 2.

14 Claims, No Drawings

PHOTORESIST COMPOSITION

CROSS-REFERENCE TO RELATED APPLICATION

This application is a nonprovisional of provisional U.S. application No. 61/490,874, filed on May 27, 2011, the contents of which are incorporated herein by reference in their entirety.

BACKGROUND

Advanced lithographic techniques such as 193 nm immersion lithography have been developed to achieve high quality and smaller feature sizes in microlithography processes, for purposes of forming ever smaller logic and memory transistors. It is important to achieve both smaller critical dimension (CD) in the imaged photoresist used in the microlithography process, and for the photoresists to provide both the lowest line edge roughness (LER) and line width roughness (LWR), while still retaining good process control tolerances such as high exposure latitude (EL) and a wide depth of focus (DOF).

The International Technology Roadmap for Semiconductors (ITRS) has recommended that feature LER (particularly for lines and trenches) should be no larger than 8% of CD, which with 65 nm features and smaller, is ever closer to the theoretical limit of LER that may be obtained based on the size of the polymer chains used in the photoresist. The design and practice of the combination of photoresist components are critical for the overall lithographic performance and the resist mixtures.

While a variety of photoacid generators (PAGs) used for formulating photoresists are found in the art, such as those disclosed in U.S. Pat. No. 7,304,175, photoresist compositions including such PAGs have not shown the improved LER performance necessary to meet the ITRS requirements.

STATEMENT OF INVENTION

The above and other deficiencies of the prior art may be overcome by, in an embodiment, a composition comprising an acid-sensitive polymer, and a cyclic sulfonium compound having the formula:

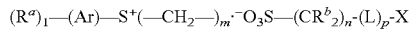

wherein each $R^a$ is independently a substituted or unsubstituted $C_{1-30}$ alkyl group, $C_{6-30}$ aryl group, $C_{7-30}$ aralkyl group, or combination comprising at least one of the foregoing, Ar is a monocyclic, polycyclic, or fused polycyclic $C_{6-30}$ aryl group, each $R^b$ is independently H, F, a linear or branched $C_{1-10}$ fluoroalkyl or a linear or branched heteroatom-containing $C_{1-10}$ fluoroalkyl, L is a $C_{1-30}$ linking group optionally comprising a heteroatom comprising O, S, N, F, or a combination comprising at least one of the foregoing heteroatoms, X is a substituted or unsubstituted, $C_5$ or greater monocyclic, polycyclic or fused polycyclic cycloaliphatic group, optionally comprising a heteroatom comprising O, S, N, F, or a combination comprising at least one of the foregoing, and l is an integer of 0 to 4, m is an integer of 3 to 20, n is an integer of 0 to 4, and p is an integer of 0 to 2.

In another embodiment, a patternable film comprises an acid-sensitive polymer, and a cyclic sulfonium compound having the formula:

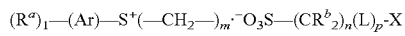

wherein each $R^a$ is independently a substituted or unsubstituted $C_{1-30}$ alkyl group, $C_{6-30}$ aryl group, $C_{7-30}$ aralkyl group, or combination comprising at least one of the foregoing, Ar is a monocyclic, polycyclic, or fused polycyclic $C_{6-30}$ aryl group, each $R^b$ is independently H, F, a linear or branched $C_{1-10}$ fluoroalkyl or a linear or branched heteroatom-containing $C_{1-10}$ fluoroalkyl, L is a $C_{1-30}$ linking group optionally comprising a heteroatom comprising O, S, N, F, or a combination comprising at least one of the foregoing heteroatoms, X is a substituted or unsubstituted, $C_5$ or greater monocyclic, polycyclic or fused polycyclic cycloaliphatic group, optionally comprising a heteroatom comprising O, S, N, F, or a combination comprising at least one of the foregoing, and l is an integer of 0 to 4, m is an integer of 3 to 20, n is an integer of 0 to 4, and p is an integer of 0 to 2.

In another embodiment, a formulation comprises an acid-sensitive polymer, a solvent, and a cyclic sulfonium compound having the formula:

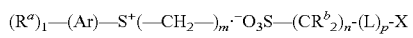

wherein each $R^a$ is independently a substituted or unsubstituted $C_{1-30}$ alkyl group, $C_{6-30}$ aryl group, $C_{7-30}$ aralkyl group, or combination comprising at least one of the foregoing, Ar is a substituted or unsubstituted monocyclic, polycyclic, or fused polycyclic $C_{6-30}$ aryl group, each $R^b$ is independently H, F, a linear or branched $C_{1-10}$ fluoroalkyl or a linear or branched heteroatom-containing $C_{1-10}$ fluoroalkyl, L is a $C_{1-30}$ linking group optionally comprising a heteroatom comprising O, S, N, F, or a combination comprising at least one of the foregoing heteroatoms, X is a substituted or unsubstituted, $C_5$ or greater monocyclic, polycyclic or fused polycyclic cycloaliphatic group, optionally comprising a heteroatom comprising O, S, N, F, or a combination comprising at least one of the foregoing, and l is an integer of 0 to 4, m is an integer of 3 to 20, n is an integer of 0 to 4, and p is an integer of 0 to 2.

DETAILED DESCRIPTION

This invention relates to a photoresist composition and film that provide features having resolution and size sufficient for advanced lithographic applications. The resist composition claimed can provide highly resolved images of submicron dimension. Improved functional performance, including low line-edge roughness (LWR), a wide depth of focus (DOE), and excellent critical dimension (CD) uniformity, are demonstrated.

The resist composition includes a) a polymer component containing an acid-cleavable labile group, which changes solubility under acid catalysis in a base developer or organic solvent developer upon exposure to acid, and b) a photoacid generator (PAG) component for generating acid. In particular, the PAG is a cyclic sulfonium PAG having a substituted or unsubstituted aromatic attached to the sulfonium center, and an anion including a sulfonate connected to a $C_5$ or greater group by a fluorinated linking group. The composition may further include at least one base additive. A solvent, and additives such as an embedded surface active additive, surfactant, and other active components, may also be included.

The composition includes a cyclic sulfonium compound having the formula (I):

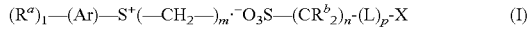 (I)

wherein, in formula (I), each $R^a$ is independently a substituted or unsubstituted $C_{1-30}$ alkyl group, $C_{6-30}$ aryl group, $C_{7-30}$ aralkyl group, or combination comprising at least one of the foregoing. As used throughout the specification and unless otherwise specified, "substituted" means having a substituent group including —OH, —SH, —CN, halogen including F, Cl, Br, or I, carboxylic acid, carboxylate, $C_{1-10}$ alkyl, $C_{3-10}$ cycloalkyl, $C_{6-10}$ aryl, $C_{7-10}$ aralkyl, $C_{1-10}$ fluoroalkyl, $C_{3-10}$ fluorocycloalkyl, $C_{6-10}$ fluoroaryl, $C_{7-10}$ fluoroaralkyl, $C_{1-10}$ alkoxy, $C_{3-10}$ cycloalkoxy, $C_{6-10}$ aryloxy, a $C_{2-10}$ ester-containing group, a $C_{1-10}$ amide-containing group, a $C_{2-10}$ imide-containing group, a $C_{3-10}$ lactone-containing group, a $C_{3-10}$ lactam-containing group, a $C_{2-10}$ anhydride-containing group, or a combination comprising at least one of the foregoing. Exemplary $R^a$ groups include, but are not limited to, methyl, ethyl, n-propyl, isopropyl, n-butyl, t-butyl, n-hexyl, neopentyl, n-octyl, n-decyl, n-dodecyl, n-octadecyl, cyclopentyl, cyclohexyl, cyclohexylmethyl, phenyl, naphthyl, benzyl, or the like. Preferably, $R^a$ includes methyl, ethyl, isopropyl, t-butyl, cyclopentyl, or cyclohexyl.

Also in formula (I), Ar is a monocyclic, polycyclic, or fused polycyclic $C_{6-30}$ aryl group. An exemplary monocyclic $C_{6-30}$ aryl group includes phenyl, tolyl, xylyl, or the like; a polycyclic $C_{6-30}$ aryl group may include biphenyl, 1,2-, 1,3-, or 1,4-(diphenyl)phenyl, or the like, and an fused polycyclic $C_{6-30}$ aryl group may include indene, indane, indanone, naphthyl, acenaphthene, fluorene, anthracene, or the like. Preferably, Ar is phenyl, 2-(1-indanone), or naphthyl. It will also be understood that as drawn, the $(-CH_2-)_m$ moiety in the formula (I) means a cyclic structure with m repeating units of —$CH_2$—, in which the free ends each connect to the sulfur; and further, that though —$CH_2$— is shown, it will be understood that one or more of the hydrogen atoms in $(-CH_2-)_m$ may be substituted for a non-hydrogen substituent group.

Also in formula (I), each $R^b$ is independently H, F, a linear or branched $C_{1-10}$ fluoroalkyl or a linear or branched heteroatom-containing $C_{1-10}$ fluoroalkyl. As used throughout this specification, the prefix "fluoro" means one or more fluorine groups attached to the associated group. For example, by this definition and unless otherwise specified, "fluoroalkyl" encompasses monofluoroalkyl, difluoroalkyl, etc., as well as perfluoroalkyl in which substantially all carbon atoms of the alkyl group are substituted with fluorine atoms. "Substantially all" in this context means greater than or equal to 90%, preferably greater than or equal to 95%, and still more specifically greater than or equal to 98% of all atoms attached to carbon are fluorine atoms. Preferably, at least one $R^b$ is F, such that at least one fluorine is located on the carbon atom closest to the point of attachment to the sulfonate group. More preferably, the two $R^b$ groups on the carbon attached to the sulfonate in formula (I) are both fluorine. Useful fluoroalkyl groups include, for example, trifluoromethyl, pentafluoroethyl, 2,2,2-trifluoroethyl, and the like. Preferably, each $R^b$ is independently F or a linear $C_{1-4}$ perfluoroalkyl group. Exemplary perfluoroalkyl groups include trifluoromethane, pentafluoroethane, heptafluoro-n-propane, and nonafluoro-n-butane.

L is a $C_{1-30}$ linking group. The linking group L may optionally include a heteroatom, including O, S, N, F, or a combination comprising at least one of the foregoing heteroatoms. Linking groups useful herein include linear or branched $C_{1-30}$ alkylene, linear or branched $C_{1-30}$ cycloalkylene, linear or branched $C_{1-30}$ heteroalkylene, and linear or branched $C_{1-30}$ heterocycloalkylene. Combinations of these groups may be used. Further, the linking group L may include a heteroatom-containing functional group moiety, such as an ether, ester, sulfonate, or amide. Such functional groups may be incorporated into the backbone of linking group L to link two different subgroups L' and L", where the total carbon content of L' and L" equals that of L. Preferably, L is thus a $C_{1-30}$ linking group including an —O—, —C(=O)—O—, —O—C(=O)—, —C(=O)—NR—, or —O—C(=O)—NR— moiety, where R is H or X. Combinations of such functional group moieties may be used. Exemplary linking groups L, or L' and L", thus may be substituted or unsubstituted and include methylene, ethylene, 1,2-propylene, 1,3-propylene, 1,4-butylene, 2-methyl-1,4-butylene, 2,2-dimethyl-1,3-propylene, 1,5-pentylene, 1,6-hexylene, 1,8-octylene, 1,4-cyclohexylene, 1,4-cyclohexylenedimethylene, fluorinated versions of the above including perfluorinated versions, and the like, and combinations comprising at least one of the foregoing.

Also in formula (I), X is a substituted or unsubstituted, $C_5$ or greater monocyclic, polycyclic or fused polycyclic cycloaliphatic group, optionally comprising a heteroatom comprising O, S, N, F, or a combination comprising at least one of the foregoing. Preferably, where X comprises a heteroatom, the heteroatom is O, S, or a combination comprising at least one of the foregoing. Exemplary monocyclic X groups include substituted or unsubstituted cyclopentyl, cyclohexyl, cycloheptyl, cyclooctyl, and the like; polycyclic X groups include substituted or unsubstituted dicycloalkyl groups, such as 2-, 3-, or 4-(cyclopropyl)cyclohexyl, 2-, 3-, or 4-(cyclopentyl)cyclohexyl, 2-, 3-, or 4-(cyclohexyl)cyclohexyl, dicyclohexylmethyl, and the like; and fused polycyclic cycloaliphatic groups include substituted or unsubstituted norbornyl, adamantyl (sometimes abbreviated "Ad" herein), steroidal groups such as those derived from cholic acid, polycyclic lactones, or the like. Preferably, X is substituted or unsubstituted, and is a $C_{19}$ or less adamantyl group, $C_{19}$ or less norbornenyl group, $C_{7-20}$ lactone, steroidal group, or $C_{20}$ or greater non-steroidal organic group.

Also in formula (I), l is an integer of 0 to 4, m is an integer of 3 to 20, n is an integer of 0 to 4, and p is an integer of 0 to 2. Preferably, l is 1, m is 5 to 12, n is 1 or 2, o is 0-2, and p is 0 or 1. When p is 1, L is —O—C(=O)— or —C(=O)—O—, and X is —$CH_2$-Ad, -Ad, or a steroidal group, and Ad is a 1- or 2-adamantyl group optionally comprising a substituent group comprising —OH, $C_{1-20}$ alkoxy, $C_{1-20}$ haloalkoxy, or a combination comprising at least one of the foregoing.

The cation portion of formula (I) may be a cation of formula (I-a), (I-b), or (I-c):

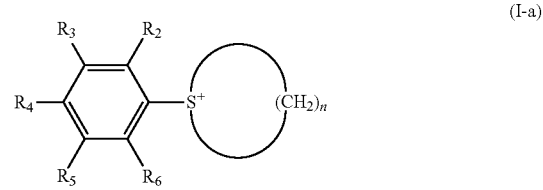

(I-a)

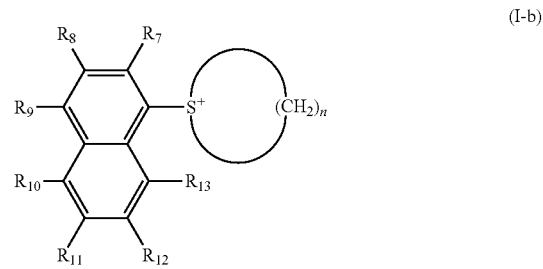

(I-b)

-continued

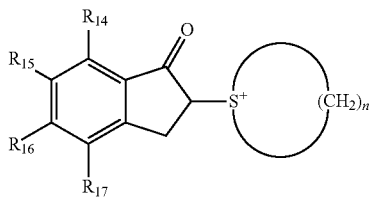
(I-c)

where $R_2$ to $R_{17}$ are independently H or a $C_{1-10}$ alkyl group where at least one of $R_2$ to $R_6$, $R_7$ to $R_{13}$, and $R_{14}$ to $R_{17}$ is a $C_{1-10}$ alkyl group; and n is 3 to 7. An exemplary cation includes that having the following structure:

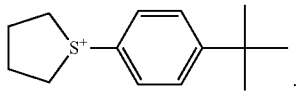

The anion portion of formula (I) may have the formula (I-d)

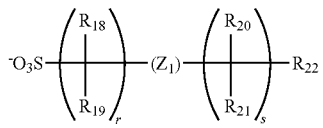
(I-d)

wherein $R_{18}$ to $R_{21}$ are independently H, F, $C_{1-10}$ alkyl, or $C_{1-10}$ fluoroalkyl, $R_{22}$ is norbornyl, cholate, a $C_8$ caged lactone, or a 1- or 2-adamantyl group having an —OH, —OCH$_3$, or —OCF$_3$ group, r is an integer of from 2 to 4, s is an integer of from 0 to 4 and $Z_1$ is a single bond, —O—, —O—C(=O)—, or —C(=O)—O— where s is 1. Preferably, where $R_{22}$ is Ad or HO-Ad, $Z_1$ is a single bond, O—C(=O)— where s is 0, or —C(=O)—O— where s is 1. Exemplary anions include those having the following structures:

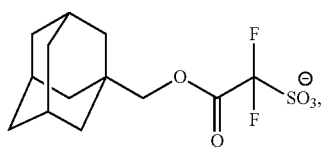

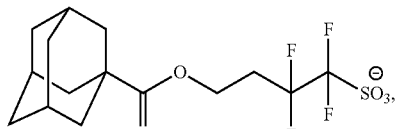

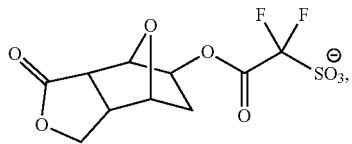

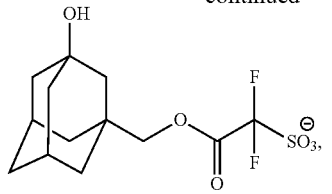

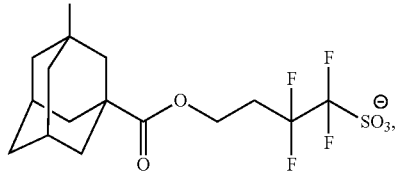

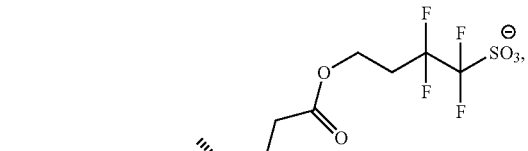

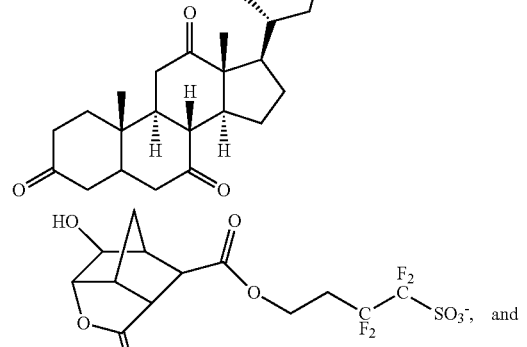
, and

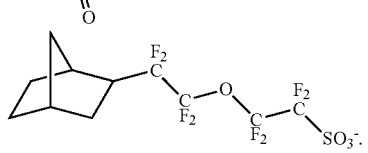

The composition also comprises an acid-sensitive polymer. The acid-sensitive polymer is suitable for use in a photoresist composition, and contains as structural units a) an acid-cleavable protective group-containing monomeric unit having at least one acid-cleavable protective group, which changes solubility of the polymer in base developer or organic solvent developer after deprotection (i.e., removal of the acid-cleavable protective group, and b) a lactone monomeric unit having at least one monocyclic, polycyclic, or fused polycyclic lactone (sometimes referred to herein as a "cage lactone") unit. The polymer may further include other monomeric units not identical to the acid-cleavable protective group-containing monomeric unit and the lactone monomer units. Such additional monomeric units include those having fused polycyclic groups which impart etch resistance, functional group-containing units for improved wetting or adhesion, or surface active groups. The acid-sensitive polymer may be a single polymer containing two or more monomeric units with different acid-cleavable protective groups in a single polymer, a blend of polymers each containing one or more acid-cleavable protective groups, or a combination comprising at least one of these types of polymers.

Preferably, the acid-sensitive polymer comprises a structural unit having an acid-cleavable protective group protecting a base-soluble group, wherein of the base soluble group comprises a carboxylic acid group, sulfonic acid group, amide group, sulfonamide group, sulfonimide group, imide group, phenol group, thiol group, azalactone group, hydroxyoxime group, or a combination comprising at least one of the foregoing. Preferably, the acid-sensitive polymer has a (meth)acrylate backbone, and is the reaction product of (meth)acrylate monomers having the specified functional groups, with a radical initiator. As used herein, "(meth) acrylate" means acrylate or methacrylate or a combination comprising at least one of these polymerizable groups.

Preferably, the structural unit having the acid-cleavable protective group is derived from a monomer having the formula (II):

$$H_2C=C(R^c)-C(=O)-O-A^1 \tag{II}$$

where, in formula (II), $R^c$ is H, $C_{1-6}$ alkyl, F, or $CF_3$, and $A^1$ is a $C_{4-50}$ tertiary alkyl-containing group in which a tertiary center of $A^1$ is connected to an ester oxygen atom of the monomer. $A^1$ is t-butyl, 1-ethylcyclopentyl, 1-methylcyclopentyl, 1-ethyl cyclohexyl, 1-methyl cyclohexyl, 2-ethyl-2-adamantyl, 2-methyl-2-adamantyl, 1-adamantylisopropyl, 2-isopropyl-1-admantanyl, or a combination comprising at least one of the foregoing.

Preferably, the structural unit having the acid-cleavable protective group is derived from a monomer having the formula (III):

$$H_2C=C(R^d)-C(=O)-O-C(R^e)_2-O-(CH_2)_o-A^2 \tag{III}$$

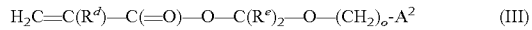

wherein $R^d$ is H, $C_{1-6}$ alkyl, F, or $CF_3$, each $R^e$ is independently H or a $C_{1-4}$ alkyl group, $A^2$ is a $C_{1-30}$ cycloaliphatic group or a $C_{1-4}$ alkyl group, and o is an integer of 0-4.

Exemplary monomers having acid-cleavable protective groups include:

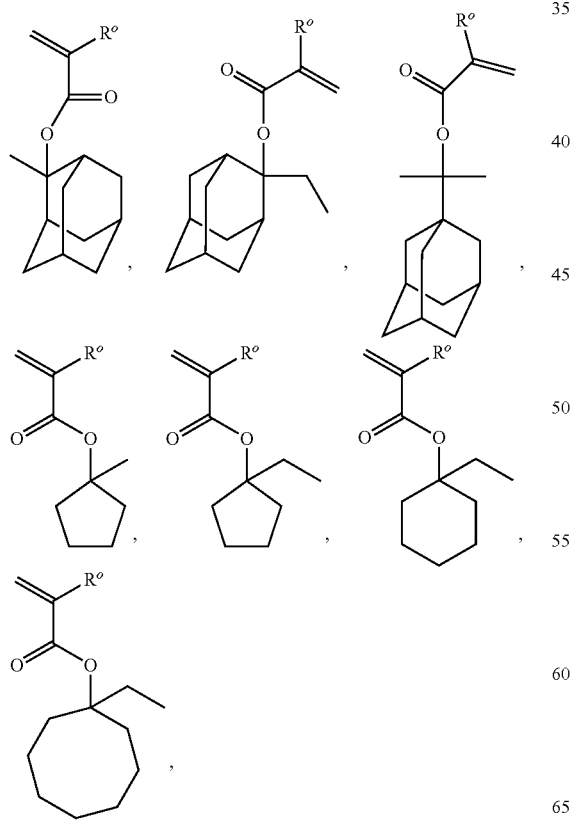

or a combination comprising at least one of the foregoing, wherein $R^o$ is H, $C_{1-6}$ alkyl, or $CF_3$.

The polymer also includes a lactone monomer. Exemplary lactone monomers include:

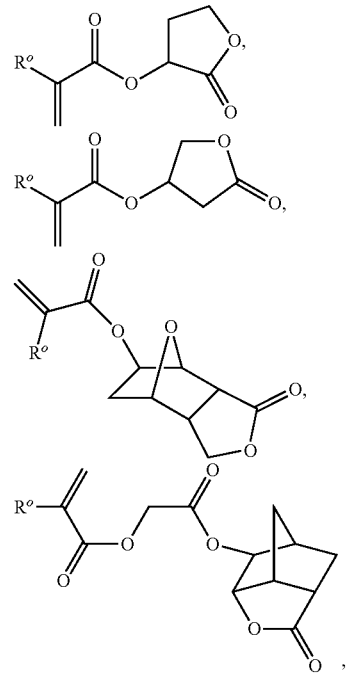

or a combination comprising at least one of the foregoing, wherein $R^o$ is H, $C_{1-6}$ alkyl, or $CF_3$.

The polymer also includes a polar monomer. An exemplary polar monomer may include:

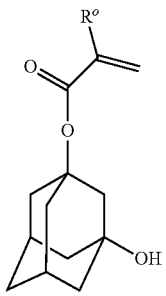

or a combination comprising the foregoing and at least one additional monomer, wherein $R^o$ is H, $C_{1-6}$ alkyl, or $CF_3$.

The composition may further include a quencher. Quenchers may include, for example, those based on hydroxides, carboxylates, amines, imines, and amides. Preferably, a useful quencher is an amine, an amide, a carbamate, or a combination comprising at least one of the foregoing. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines, amides and carbamates such as Troger's base, a hindered amine such as diazabicycloundecene (DBU) or diazabicyclononene (DBN), N-(t-butyloxycarbonyl)-2-amino-2-(hydroxymethyl)-1,3-dihydroxypropane (NTBOC- TRIS), t-butyloxycarbonyl-4-hydroxypyridine (TBOC-4HP), or ionic quenchers including quaternary alkyl ammonium salts such as tetrabutylammonium hydroxide (TBAH) or tetrabutyl ammonium lactate.

The composition may be formulated as a photoresist formulation, which includes, in addition to the polymer, the compound of formula (I), and quencher, a solvent, and optionally an additive comprising, a surfactant, an embedded surface active additive, or a combination comprising at least one of the foregoing.

Solvent generally suitable for dissolving, dispensing, and coating the components include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist composition disclosed herein may include the polymer in an amount of 50 to 99 wt %, specifically 55 to 95 wt %, more specifically 60 to 90 wt %, and still more specifically 65 to 90 based on the total weight of solids. It will be understood that "polymer" used in this context of a component in a photoresist may mean only the polymer disclosed herein, or a combination of the polymer with another polymer useful in a photoresist. The photoacid generator may be present in the photoresist in an amount of 0.01 to 20 wt %, specifically 0.1 to 15 wt %, and still more specifically 0.2 to 10 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photoacid generator, quencher, surfactant, and any optional additives, exclusive of solvent.

The photoresist disclosed herein may be used to form a film comprising the photoresist, where the film on the substrate constitutes a coated substrate. Such a coated substrate includes: (a) a substrate having one or more layers to be patterned on a surface thereof; and (b) a layer of the photoresist composition over the one or more layers to be patterned. Preferably, patterning is carried out using ultraviolet radiation at wavelength of less than 248 nm, and in particular, at 193 nm. Preferably, a patternable film comprises an acid-sensitive polymer, and a cyclic sulfonium compound of formula (I).

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 200 mm, 300 mm, or larger in diameter, or other dimensions useful for wafer fabrication production.

The invention is further illustrated by the following examples. All compounds and reagents used herein are available commercially except where a procedure is provided below.

t-Butylphenyl tetramethylenesulfonium 4-adamantanecarboxyl-1,1,2,2-tetrafluorobutane sulfonate (TBPTMS Ad-TFBS) was prepared by a five-step synthesis as described in Scheme 1 and the following paragraphs. The detailed synthetic procedures for each step are outlined below.

Scheme 1.

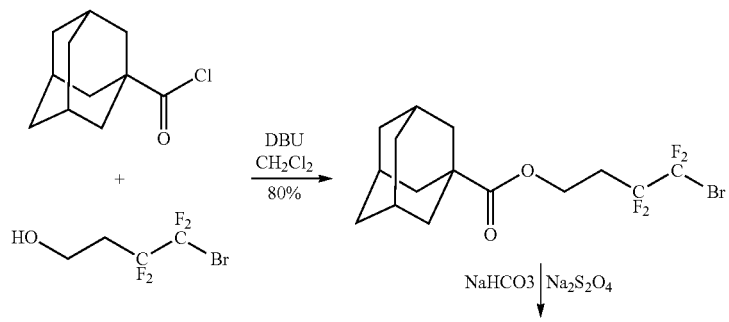

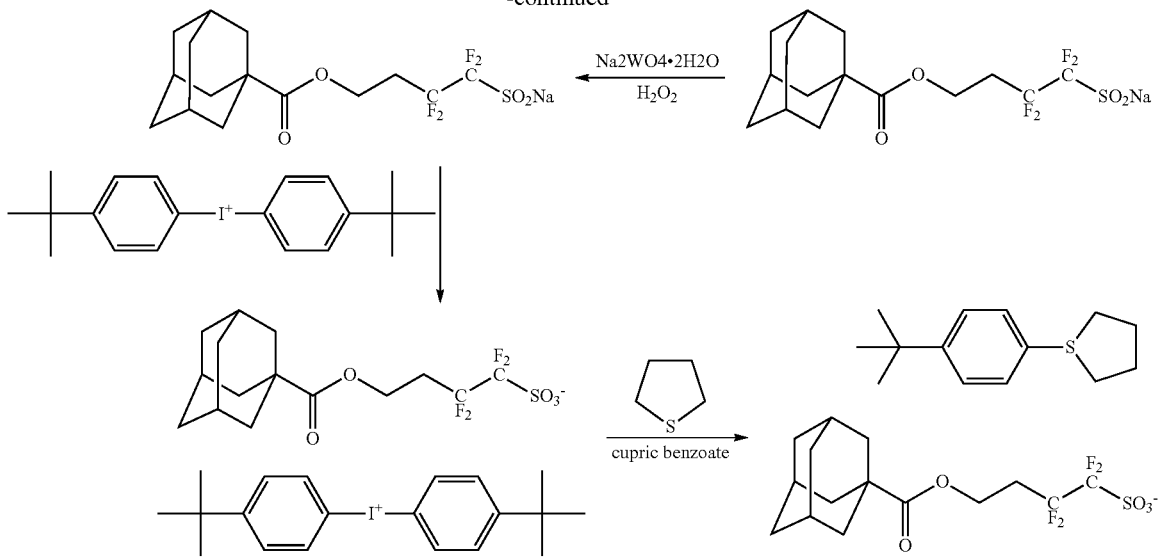

In the first step, adamantane-1-carboxylic acid 4-bromo-3,3,4,4-tetrafluoro-butyl ester was prepared by the following procedure. To a 1 L, 3-necked flask equipped with a thermometer, pressure equalizing dropping funnel and condenser w/$N_2$ gas inlet was added 100 g (503 mmol) adamantane acid chloride), 113.2 g (503 mmol) hydroxytetrafluorobromobutane and 400 ml of dichloromethane. The reaction mixture was cooled to 5° C. and a solution of 91.76 gram (603 mmol) of diazobicycloundecane (DBU) in 100 ml $CH_2Cl_2$ was added over 90-120 minutes. After completion of the addition, the reaction mixture was allowed to warm to room temperature, and the temperature was then raised to and held at reflux for 20 h. The reaction mixture was washed 4×500 ml with 20% (w/w) aqueous HCl, and further washed with deionized water to a constant pH of 6. The solvent layer was collected, and the solvent removed to provide an oil, which was stirred under high vacuum at 60° C. to remove any alcohol, to yield 165 g (85%) of pure product.

In the second step, adamantane-1-carboxylic acid 3,3,4,4-tetrafluoro-5-sulfinatobutyl ester sodium salt was prepared using the following procedure. To a 3 L, 3-neck round bottom flask equipped with a thermometer, overhead stirrer and condenser w/$N_2$ gas inlet, 150 g (387 mmol) of adamantyl fluorobromobutane ester of the first step was added into degassed aqueous acetonitrile solution (750 ml $H_2O$ and 750 ml acetonitrile) containing 155 g (891 mmol) of sodium dithionite and 97.6 g sodium bicarbonate. The reaction mixture was heated to 50° C. for about 18 h. then cooled to room temperature. The aqueous layer was then isolated and washed with 200 ml acetonitrile. The combined acetonitrile solution was dried over $MgSO_4$ and the solvent removed, to leave about 200 g of the intermediate as a waxy solid. The solid was stirred with 600 ml of diisopropyl ether (IPE) for one hour, filtered and again stirred with 400 ml of diisopropyl ether. The product was collected and dried under vacuum dry at 50° C. for 18 h. to yield 149 g of the sulfinate intermediate (yield 97.6%).

In the third step, sodium 1-adamantyl-3,3,4,4-tetrafluorobutane sulfonate was prepared by the following procedure. In a 2 L 3-neck round bottom flask equipped with a thermometer, overhead stirrer and condenser w/$N_2$ gas inlet, 140 g (355 mmol) of adamantyl fluorobutane sulfinate from the second step, 92.5 gram (816 mmol) of 30 wt % aqueous hydrogen peroxide solution, 0.28 g (0.85 mmol) of sodium tungstate dihydrate, were mixed with 1,400 ml of deionized water. The reaction mixture was stirred at room temperature 1.5 h, and the excess hydrogen peroxide was quenched with 1.5 eq. of sodium sulfite ($Na_2SO_3$). The mixture was combined with 2 L of ethyl acetate. The mixture was allowed to separate into three liquid layers. The middle water layer was separated from the remaining layers, extracted 2×1.5 L of ethyl acetate, and the extracts combined with the bottom oily layer. Ethyl acetate was then evaporated, leaving about 157 g of a waxy solid. The solid was dissolved in 260 ml of acetone and stirred with 2,600 ml of diisopropyl ether (IPE). The resulting mixture was collected by filtration and the white solid so obtained was washed with 200 ml of IPE. The waxy white material was vacuum dried at 50° C. for 16 h. to yield 87 g (60%) of the sulfonate intermediate.

In the fourth step, adamantane-1-carboxylic acid 3,3,4,4-tetrafluoro-5-sulfonatobutyl ester bis(t-butylphenyl) iodonium salt was prepared by the following procedure. In a 2 L 3-neck round bottom flask equipped with a thermometer, overhead stirrer and condenser w/$N_2$ gas inlet, 50 g (121.9 mmol) of adamantyl fluorobutane sulfonate from the second step, and 50.1 g (110.8 mmol) of bis(t-butylphenyl) iodonium acetate, were mixed with 400 ml of methylene chloride and 400 ml of deionized water. The reaction mixture was stirred at room temperature for 64 h. The mixture was added to a 2 L separatory funnel and the layers were separated. The water layer was washed 2×100 ml of methylene chloride. The methylene chloride fractions were combined and washed with 500 ml of 1% (w/w) aqueous ammonium hydroxide solution, followed by washed 6×500 ml with deionized water. The methylene chloride solution was dried over magnesium sulfate, concentrated to 200 g total weight and then slowly added to 4 L of heptane to precipitate the intermediate compound. The white solid intermediate was collected by filtration and washed with 2×200 ml of heptanes and dried under vacuum to yield 86 g (90%) of the iodonium salt intermediate.

In the fifth step, adamantane-1-carboxylic acid 3,3,4,4-tetrafluoro-5-sulfonatobutyl ester (4-t-butylphenyl)tetramethylene sulfonium salt was prepared by the following procedure. In a 1 L 3-neck round bottom flask equipped with a thermometer, overhead stirrer and condenser w/$N_2$ gas inlet, 85 g (108.9 mmol) of bis(t-butylphenyl)iodonium 1-adamantyl-3,3,4,4-tetrafluorobutane sulfonate, 10.6 g (119.8 mmol) of tetrahydrothiophene, 2.84 g of cupric benzoate were combined with 400 ml of anhydrous chlorobenzene. The reaction mixture was heated to 125° C. for 5 h. and allowed to cool overnight. The reaction changed color from a blue-green to gray to pale purple-red and finally to a deep purple. Solvent was reduced by atmospheric distillation to a final volume of 200 ml. The mixture was then cooled to room temperature and precipitated into 2.5 L of diisopropyl ether (IPE) to yield a pale gray solid when dried. After dissolving the solid in 500 ml of methylene chloride, the solution was washed with 2×250 ml of 10 wt % ammonium hydroxide aqueous solution, followed by washing with 500 ml of deionized water for six times. The organic amber colored layer was dried over magnesium sulfate and stirred with 10 g of activated charcoal for 2 h., and filtered to afford a nearly colorless solution. The methylene chloride solution was reduced in volume to 100 ml and diluted with about 50 to 100 ml of IPE. This solution was added into 2 L of IPE to precipitate a white solid. The solid was air dried for 3 h. followed by vacuum drying at 50° C. overnight to yield 57.5 g of crude product. The crude was recrystallized with ethyl acetate, collected and dried under vacuum to yield 44 g (79%) of t-Butylphenyl tetramethylenesulfonium 4-adamantanecarboxyl-1,1,2,2-tetrafluorobutane sulfonate (TBPTMS Ad-TFBS) as a white solid.

(4-t-butylphenyl)tetramethylene sulfonium 5-(2-norbornyl)octafluoro-3-oxapentanesulfonate (TBPTMS NBPFEES PAG) was prepared by a five-step synthesis as described in Scheme 2 and the following paragraphs. The detailed synthetic procedures for each step are outlined below.

Scheme 2.

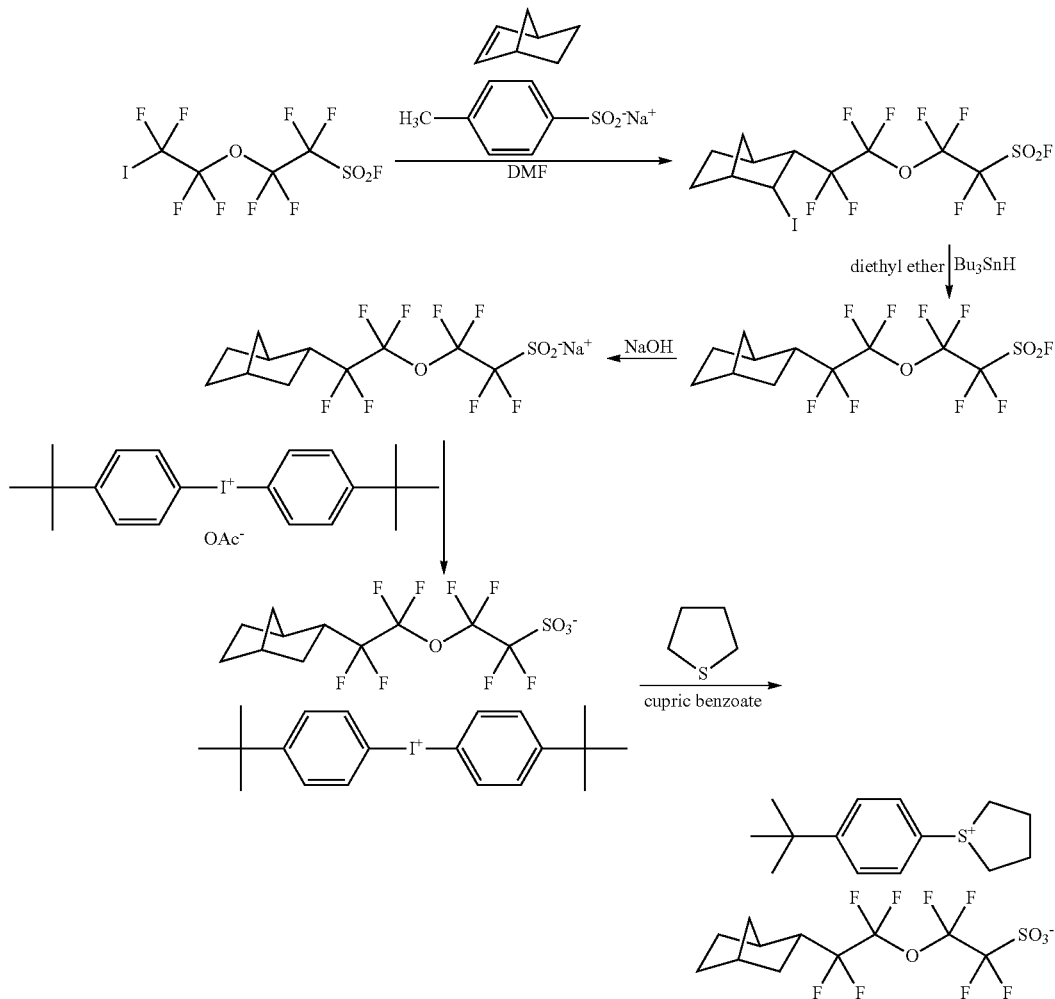

In the first step, 5-(3-iodo)-2-norbornyl)octafluoro-3-oxapentanesulfonyl fluoride (1) was prepared by the following procedure. A solution of 25-iodooctafluoro-3-oxapentanesulfonyl fluoride (20 mmol) and excess norbornene (50 mmol) in 20 mL of N,N-dimethylformamide (DMF) was taken in a flask and evacuated/filled with nitrogen several times. Sodium 4-tolylsulfinate salt (5 mmol) was added, and the resulting suspension was stirred for 17 h. at room temperature, after which time the mixture was poured into 300 ml of ether and 300 ml of water. The ether layer was separated and washed 3×100 ml with deionized water, then dried over anhydrous magnesium sulfate. The ether solution was concentrated on a rotary evaporator, and the product was purified by vacuum distillation at 100 mTorr (b.p. 67-68° C.), to yield the product (65%) as an oil.

In the second step, 5-(2-norbornyl)octafluoro-3-oxapentanesulfonyl fluoride (2) was prepared by the following procedure. A solution of 5-(3-iodo-2-norbornyl)octafluoro-3-oxapentanesulfonyl fluoride (10 mmol) from the first step, and Bu$_3$SnH (11 mmol) were refluxed in 25 ml of diethyl ether for 4 h. The excess Bu$_3$SnH was quenched by adding aqueous solution of KF. The precipitate formed was removed by filtration and the solution extracted 3×100 ml with diethyl ether. After drying over magnesium sulfate, the ether solution was concentrated under vacuum by rotary evaporation. The product was purified by vacuum distillation at 7 Torr (b.p. 84-85° C.) to yield (70%) the product as an oil.

In the third step, sodium 5-(2-norbornyl)octafluoro-3-oxapentanesulfonate (3) was prepared by the following procedure. In a 100 ml two-neck flask fitted with a condenser, 5-(2-norbornyl)octafluoro-3-oxapentanesulfonyl fluoride (1.27 mmol) from the second step was added to a stirred solution of NaOH pellets (2.54 mmol) in H$_2$O. The mixture was refluxed over night. After the reaction, the homogenous mixture was cooled to room temperature. NaF by-product was precipitated by addition of ethanol and removed by filtration. The solvent was removed under reduced pressure, and the solid so obtained was further purified by recrystallization by dissolving into 100 ml ethyl acetate, filtering through a fine glass frit funnel, and concentrating by rotary evaporation so that a minimum of solvent remained. Hexane was added to the flask, stirring for 1-2 hrs, and the product precipitated from solution. The product was collected by filtration and dried to yield pure product (70%) as a white solid.

In the fourth step, bis(t-butyphenyl)iodonium 5-(2-norbornyl)octafluoro-3-oxapentanesulfonate (4) was prepared by the following procedure. In a 100 ml 2-neck flask, 10 g (24.2 mmol) of sodium 5-(2-norbornyl)octafluoro-3-oxapentanesulfonate from the third step, 9.9 g (22.0 mmol) of bis(t-butylphenyl) iodonium acetate, were mixed with 100 ml of methylene chloride and 50 ml of deionized water. The reaction mixture was stirred at room temperature for 40 hours. The mixture was added to a 500 ml separatory funnel and the layers were separated. The water layer was washed 100 ml of methylene chloride twice. The methylene chloride fractions were combined and washed with 100 ml of 1% ammonium hydroxide aqueous solution twice, followed by washed with 100 ml of deionized water for six times. After dried over magnesium sulfate, the solution was concentrated to 50 ml of total volume and then slowly added into 200 ml of heptanes with stirring. The white solid was further washed with 100 ml of heptanes twice and vacuum dried overnight to yield 14.3 g (83%) of product.

In the fifth step, (4-t-butylphenyl)tetramethylene sulfonium 5-norbornylloctafluoro-3-oxapentanesulfonate (5) was prepared by the following procedure. A 50 ml 3-neck round bottom flask was equipped with a thermometer and condenser w/N$_2$ gas inlet, and 7 g (8.9 mmol) of bis(t-butyphenyl)iodonium 5-(2-norbornyl)octafluoro-3-oxapentanesulfonate from the fourth step, 0.96 gram (9.4 mmol) of tetrahydrothiophene, and 0.07 g cupric benzoate (0.23 mmol) were mixed in 20 ml of anhydrous chlorobenzene. The reaction mixture was heated to 120° C. for 5 hours, allowed to cool overnight, and 100 ml of t-butylmethyl ether added to the reaction flask. The resulting precipitate was collected by filtration, and the solid was re-dissolved in 100 ml methylene chloride and washed 2×50 ml with 10 wt % aqueous ammonium hydroxide solution, then washed 6×100 ml with deionized water. The methylene chloride solution was dried over MgSO$_4$, the solvent removed by rotary evaporation, then 200 ml of t-butylmethyl ether was mixed with the solid and stirred at 55° C. for 24 h. The solid was collected by filtration and dried under vacuum to yield 3.8 g (69%) of pure final product.

Triphenylsulfonium 1-adamantylmethyl difluorosulfoacetate (TPS 1-AdCH$_2$O-CDFMS) as a comparative PAG was prepared by a three-step synthesis as described in Scheme 3 and the following paragraphs. The detailed synthetic procedures for each step are outlined below.

Scheme 3

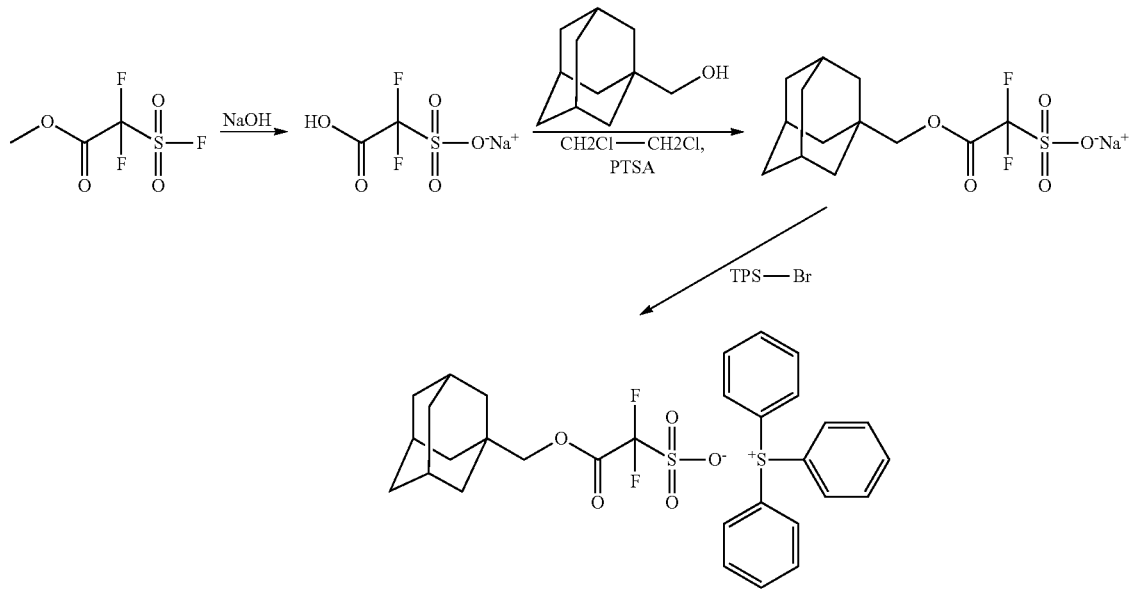

In the first step, sodium difluorosulfoacetate was prepared by the following procedure. A mixture of 75 g (390.3 mmol) of methyl difluoro(fluorosulfonyl)acetate in 300 g deionized water was charged to a flask cooled in an ice bath, and a solution of 36 g (897.9 mmol) sodium hydroxide in 200 ml of water was slowly added dropwise. The mixture was heated and reflux at 100° C. for 3 h. The pH was checked to ensure it was basic, 8 g NaOH was added, the mixture further refluxed for 3 more hours. After cooling, the mixture was neutralized and acidified with concentrated hydrochloric acid to pH<4. The mixture was concentrated, and 99 g of sodium difluorosulfoacetate was obtained (56.1%).

In the second step, 10.5 g (30.1 mmol) of sodium difluorosulfoacetate from the first step (based on 56.1% purity), 5 g (30.1 mmol) of 1-admantanemethanol and 200 g of 1,2-dichlorethane were charged into a round bottom flask equipped with a Dean-Stark Apparatus and condenser. The flask was charged with 5.68 g of p-toluenesulfonic acid monohydrate (30.1 mmol), and the mixture refluxed for 20 h., and the solvent removed by rotary evaporation. Acetonitrile (2×250 ml) was used to wash the solid. The solid was collected by filtration and the difluorosulfoacetate was concentrated by rotary evaporation and precipitated into t-butylmethylether (to remove 1-admantanemethanol). The precipitate was removed by filtration, and the filtrate was concentrated and dried to yield 2.13 g sodium 1-admantylmethyl difluorosulfoacetate.

In the third step, 2.13 g (6.15 mmol) of sodium 1-admantylmethyl difluorosulfoacetate from the second step was dissolved in 20 g of acetonitrile. A solution of 2 g (5.86 mmol) of triphenylsulfonium bromide in 30 g deionized water was added to the acetonitrile solution. The solution was stirred for 24 h., and extracted 2×200 ml with methylene chloride. The combined organic layers were washed 6×300 ml with deionized water and dried over magnesium sulfate. After concentrating to minimize the solvent, the concentrate was precipitated into 300 ml hexane, and the precipitate was collected and dried, to yield 2.4 g of triphenylsulfonium 1-admantylmethyl difluorosulfoacetate.

Polymers used in the examples were prepared by the following methods. Monomers used in the preparation of these polymers were obtained commercially. The monomers are shown below and include (A) ECPMA; (B) α-GBLMA; (C) IAMA; (D) EAMA; (E) HAMA; and (F) MAMA. Weight average molecular weight (Mw) and polydispersity (Mw/Mn) were determined by gel permeation chromatography (GPC) using a sample concentration of 1 mg/ml and a crosslinked styrene-divinylbenzene column with universal calibration curve calibrated with polystyrene standards, and eluted with tetrahydrofuran at a flow rate of 1 ml/min.

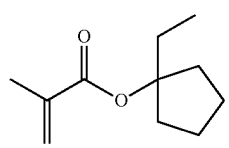

(A)

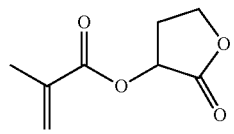

(B)

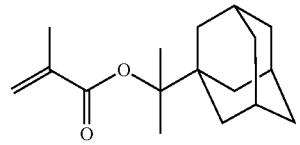

(C)

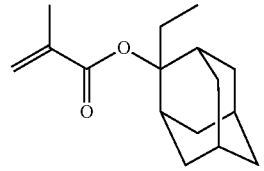

(D)

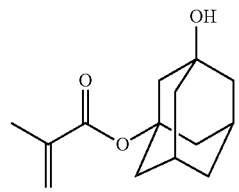

(E)

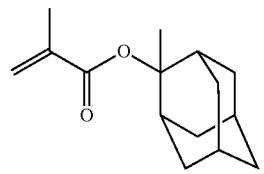

(F)

The polymer ECPMA/EAMA/MAMA/a-GBLMA/HAMA (molar ratio 25/10/15/30/20, respectively) was prepared by the following procedure. 44.7 g of 1-ethylcyclopentyl methacrylate (ECPMA) (245.2 mmol), 24.4 g of 2-ethyladamantan-2-yl methacrylate (EAMA) (98.2 mmol), 34.5 g of 2-methyladamantan-2-yl methacrylate (MAMA) (147.2 mmol), 50.1 g of alpha-gamma butyrolactone methacrylate (a-GBLMA) (294.4 mmol) and 46.4 g of 3-hydroxyadamantan-1-yl methacrylate (HAMA) (196.4 mmol) were dissolved in 200 g of tetrahydrofuran and degassed with bubbled nitrogen. A solution of 20.3 g of dimethyl-2,2-azo(bis)diisobutyrate initiator (VAZO V-601, available from DuPont) (88.2 mmol) in 20 g of tetrahydrofuran was weighed into a separate flask and degassed with bubbled nitrogen. The flask containing initiator solution was heated to 70° C., and the monomer solution was then fed into the initiator solution over 3.5 h. then held at temperature for 30 minutes. 170 g of tetrahydrofuran was then added and the solution cooled to room temperature. The solution was then precipitated into 20× volumes of isopropyl alcohol, the resulting precipitated polymer collected by filtration, dried, redissolved in tetrahydrofuran to approximately 30% w/w concentration and reprecipitated in a second 20× volume of isopropyl alcohol. The polymer was then dried overnight at 45° C. under vacuum to yield the target polymer (83%). Mw=8,640; Mw/Mn=1.43.

The polymer IAM/ECP/a-GBLMA/HAMA (molar ratio 20/10/50/20, respectively) was prepared by the following procedure. 38.7 g of adamantyl isopropyl methacrylate (IAM) (147.3 mmol), 13.5 g of 1-ethylcyclopentyl methacrylate (ECPMA) (74.1 mmol), 63.0 g of alpha-(gamma butyrolactone) methacrylate (α-GBLMA) (369.3 mmol) and 34.8 g of 3-hydroxyadamantan-1-yl methacrylate (HAMA) (147.3 mmol) were dissolved in 150 g of tetrahydrofuran and degassed with bubbled nitrogen. A solution of 13.6 g dimethyl-2,2-azo(bis)diisobutyrate (VAZO V-601 initiator, available from DuPont) (59.1 mmol) in 20 g of tetrahydrofuran was weighed into a separate flask and degassed with bubbled nitrogen. The flask containing initiator solution was heated to 70° C., and the monomer solution was then fed into the initiator solution over 3.5 h. and the temperature maintained for 30 minutes. 110 g of tetrahydrofuran was then added and the solution cooled to room temperature. The solution was then precipitated into 20× volumes of isopropyl alcohol, the resulting precipitated polymer collected by filtration, dried, redissolved in tetrahydrofuran to approximately 30% w/w concentration and reprecipitated in a second 20× volume of isopropyl alcohol. The polymer was then dried overnight at 45° C. under vacuum to yield the target polymer (93%). Mw=9737; Mw/Mn=1.82.

The photoresists were formulated using the components and proportions shown below. Note that the PAG (see table), base (t-butyloxycarbonyl-4-hydroxypyridine, TBOC-4HP), and surface leveling agent (SLA; also referred to as surfactant) PF 656, available from Omnova, are each provided below as weight percent based on 100% solids content, with the balance of the solids being the polymer. The proportions of solvents (propylene glycol methyl ether acetate, PGMEA; HBM; and cyclohexanone, CH) are based on the total solvent weight; the final % solids is after dilution of the solids with the combined solvents.

Photoresist formulation compositions for Examples 1-3 and Comparative Examples 1 and 2, are shown in Table 1 below:

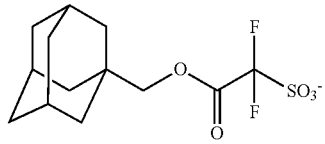
(H)

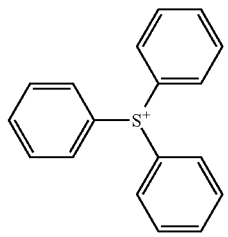

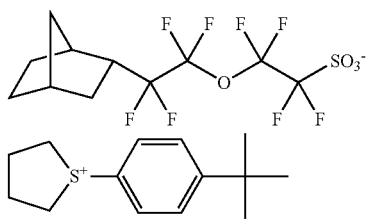
(J)

TABLE 1

| Example | Polymer[a] (monomer molar ratio) | PAG | PAG (wt %) | Base (TBOC-4HP) (wt %) | SLA (PF656) (wt %) | PGMEA (w/w of solvent) | HBM (w/w of solvent) | CH (w/w of solvent) | % solids |
|---|---|---|---|---|---|---|---|---|---|
| Ex. 1 | ECP/EAMA/MAMA/aBLMA/HAMA (25/10/15/30/20) | TBPTMS-AdTFBS | 14.141 | 0.805 | 0.150 | 50 | 50 | — | 3.8 |
| CEx. 1 | ECP/EAMA/MAMA/aBLMA/HAMA (25/10/15/30/20) | TPS-Ad-DFMS | 6.814 | 0.402 | 0.150 | 30 | 50 | 20 | 3.8 |
| Ex. 2 | IAM/ECPMA/aBLMA/HAMA (20/10/50/20) | TBPTMS-AdTFBS | 12 | 0.9279 | — | 50 | 50 | — | 3.6 |
| Ex. 3 | IAM/ECPMA/aBLMA/HAMA (20/10/50/20) | TBPTMS-NBPFEES | 10.296 | 0.9279 | — | 50 | 50 | — | 3.6 |
| CEx. 2 | IAM/ECPMA/aBLMA/HAMA (20/10/50/20) | TPS-Ad-DFMS | 6 | 0.5146 | — | 50 | 50 | — | 3.6 |

[a]Each polymer Mw falls in the range 8,500-10,000.

PAGs used to prepare lithographic Examples 1-3, and Comparative Examples 1 and 2 include: (G) TBPTMS-AdTFBS; (H) TPS-Ad-DFMS (comparative); and (J) TBPTMS-NBPFEES.

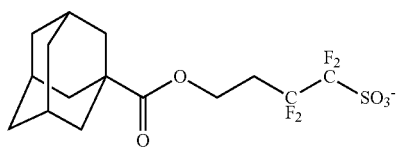
(G)

Lithographic evaluation was carried out as follows. For Resist Example 1 and Comparative Example 1, the formulated photoresists were spin coated using a TEL Clean Track™ Lithius-i+™ (Tokyo Electron) coating track onto a 300 mm silicon wafer having sequentially applied first and second bottom antireflective coatings (BARC) (respectively, AR™ 124 and AR™ 26N, Dow Electronic Materials), and soft baked at 100° C. for 60 seconds, to form a resist film of about 110 nm in thickness. A top coat OC™ 2000 was applied onto the resist film and baked at 90° C. for 60 seconds. The photoresist layer was exposed using a Twin-Scan™ XT: 1900i, 1.35 NA stepper (ASML) operating at 193 nm through a photomask with contact hole feature size of 55 nm, under C-Quad 40 exposure with outer/inner sigma of 0.97/0.82 and with XY polarization. The exposed wafers were post-exposed baked (PEB) at 95° C. for 60 seconds. The exposed wafers were next treated with a metal ion free base developer (0.26N aqueous tetramethylammonium hydroxide solution) to develop the exposed photoresist layer. Sizing dose was defined as an exposure energy to print the target contact hole diameter by varying exposure energy.

Exposure latitude (EL) was defined as a difference in exposure energy to print +/−10% of the target diameter normalized by the sizing energy. Underexposure margin was defined as a minimum diameter to print a contact hole without any visible failure such bridging or scumming Cell depth of focus was determined by a defocus range that gives +/−10% of the target diameter. 3σ of diameters were calculated from a standard deviation of 300 measured diameters of contact holes at the best focus and at the sizing energy. All the scanning electron microscope (SEM) images were collected with a Hitachi 9380 CD-SEM, operating at an accelerating voltage of 800 volts (V), probe current of 8.0 picoamperes (pA), using 200 Kx magnification.

For Resist Examples 2 and 3, and Comparative Example 1, the formulated photoresists were spin coated using TEL ACT-8 (Tokyo Electron) coating track onto a 200 mm silicon wafer having as bottom antireflective coating (BARC) (AR™ 77, Dow Electronic Materials), and soft baked at 110° C. for 60 seconds, to form a resist film of about 100 nm in thickness. The photoresist layer was exposed using an ASML/1100, 0.75 NA stepper operating at 193 nm through a photomask with PSM feature size of 90 nm 1:1 Line/Space pattern, under Annular illumination with outer/inner sigma of 0.89/0.64 with focus offset/step 0.10/0.05. The exposed wafers were post-exposed baked (PEB) at 105° C. for 60 seconds. The coated wafers were next treated with a metal ion free base developer (0.26N aqueous tetramethylammonium hydroxide solution) to develop the photoresist layer. Mask Error Factor (MEF), Exposure Latitude (EL), Line Edge Roughness (LER) and Line Width Roughness (LWR) and Depth of Focus (DOF) were determined by processing the image captured by top-down scanning electron microscopy (SEM) using a Hitachi 9380 CD-SEM, operating at an accelerating voltage of 800 volts (V), probe current of 8.0 picoamperes (pA), using 200 Kx magnification. LER and LWR were measured over a 2 μm line length in steps of 40 nm, and reported as the average for the measured region.

Evaluation of formulation of Example 1 (TBPTMS-AdTFBS) and Comparative Example 1 (TPS-Ad-DFMS) was carried out using an ASML with matched photospeeds of dose-to-size ($E_{size}$). The data are shown in Table 2.

TABLE 2

| Example | Illumination Condition | Target Feature | Esize (55 nm) | EL % | EL (nm/mJ) | UEM | CELL DOF | 3σ of diameters |
|---|---|---|---|---|---|---|---|---|
| Ex. 1 | ASML 1900i, 1.35NA, C-Quad 40, o/i sigma = 0.97/0.82, XY-polarization | 55 um Contact Hole | 43.6 | 13.2 | 2.00 | 38.8 | 180 | 4.3 |
| CEx. 1 | | | 43.0 | 11.4 | 2.02 | 39.8 | 100 | 4.7 |

As shown in Table 2. Example 1 which included TBPTMS-AdTFBS showed improved exposure latitude (EL), cell depth of focus (DOF), and CD uniformity based on 3-sigma standard deviation of imaged contact hole diameters, relative to Comparative Example 1 (TPS-Ad-DFMS).

Lithographic evaluation of the formulations of Examples 2 and 3 (TBPTMS-AdTFBS and TBPTMS-NBPFEES, respectively) and Comparative Example 2 (TPS-Ad-DFMS) was carried out at equal loadings as seen in Table 1. The data are shown in Table 3.

TABLE 3

| Example | Illumination Condition | Feature | MEF | EL @10% of CD Target | LER | LWR | DOF (μm) |
|---|---|---|---|---|---|---|---|
| Ex. 2 | Annular NA/Sigma: 0.7 0.89/0.64 (O/I) Focus offset/step 0.10/0.05 | 90 nm L/S 1:1 | 3.18 | 11.7 | 5.1 | 6.6 | 0.6 |
| Ex. 3 | | | 3.7 | 10.6 | 5.1 | 7.3 | 0.6 |
| CEx. 2 | | | 3.2 | 16.3 | 6.6 | 9.8 | 0.5 |

As shown in Table 3, Example 2 which included TBPTMS-AdTFBS showed the improved overall performance based on exposure latitude (EL), mask error factor (MEF), depth of focus (DOF), line edge roughness (LER), and line width roughness (LWR). Example 3 showed the most improved EL performance, while showing comparable LER and DOF to that of Example 2, and an intermediate LWR performance relative to Example 2 and Comparative Example 2.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A composition comprising:
   an acid-sensitive polymer, and
   a cyclic sulfonium compound having the formula:

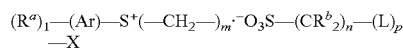

or the formula:

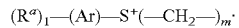

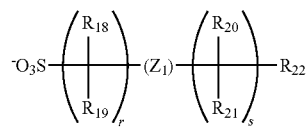

wherein
   $R^a$ is isopropyl, t-butyl, cyclopentyl, or cyclohexyl,
   Ar is para-phenylene,
   each $R^b$ is independently F or a linear $C_{1-4}$ perfluoroalkyl group,
   L is a $C_{1-30}$ linking group including an C(=O)—NR— or —O—C(=O)—NR— moiety, wherein R is H or X,
   X is a substituted or unsubstituted, $C_5$ or greater polycyclic or fused polycyclic cycloaliphatic group, optionally comprising a heteroatom comprising O, S, N, F, or a combination comprising at least one of the foregoing,
   $Z_1$ is —O— or —O—C(=O)—,
   $R_{18}$ to $R_{21}$ are independently H, F, $C_{1-10}$ alkyl, or $C_{1-10}$ fluoroalkyl,
   $R_{22}$ is norbornyl, cholate, a $C_8$ caged lactone, or a 1- or 2-adamantyl group optionally comprising an —OH, —OCH$_3$, or —OCF$_3$ group, and
   l is 1, m is 4, n is 2, p is 1, r is 2 to 4, and s is 0 to 4, provided that when $Z_1$ is —O—C(=O)— and s is 0, r is 4, wherein the acid-sensitive polymer comprises:
   (i) a structural unit comprising a monocyclic acid-cleavable group protecting a base-soluble group,
   (ii) a structural unit comprising a polycyclic acid-cleavable group protecting a base-soluble group,
   wherein the structural unit having the monocyclic or polycyclic acid-cleavable protective group is derived from
   a monomer having the formula:

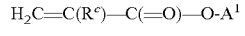

wherein $R^c$ is H, $C_{1-6}$ alkyl, F, or CF$_3$ and $A^1$ is a $C_{4-50}$ tertiary alkyl-containing group in which a tertiary center of $A^1$ is connected to an ester oxygen atom of the monomer, or
   a monomer having the formula:

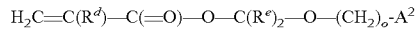

wherein $R^d$ is H, $C_{1-6}$ alkyl, F, or CF$_3$, each $R^e$ is independently H or a $C_{1-4}$ alkyl group, $A^2$ is a $C_{1-30}$ cycloaliphatic group, and o is an integer of 0-4,
   (iii) a structural unit derived from a lactone monomer, and
   (iv) a structural unit derived from a polar monomer comprising a hydrogen donor group.

2. The composition of claim 1, wherein X is substituted or unsubstituted and is a $C_{19}$ or less adamantyl group, $C_{19}$ or less norbornenyl group, $C_{7-20}$ lactone, steroidal group, or $C_{20}$ or greater non-steroidal organic group.

3. The composition of claim 1, wherein X is substituted or unsubstituted and is $C_{19}$ or less norbornenyl group, $C_{7-20}$ lactone, steroidal group, or $C_{20}$ or greater non-steroidal organic group.

4. The composition of claim 1, wherein:
   X is —CH$_2$-Ad, -Ad, or a steroidal group, and Ad is a 1- or 2-adamantyl group optionally comprising a substituent group comprising —OH, $C_{1-20}$ alkoxy, $C_{1-20}$ haloalkoxy, or a combination comprising at least one of the foregoing.

5. The composition of claim 1, wherein the base soluble group comprises a carboxylic acid group, sulfonic acid group, amide group, sulfonamide group, sulfonimide group, imide group, phenol group, thiol group, azalactone group, hydroxyoxime group, or a combination comprising at least one of the foregoing.

6. The composition of claim 1, wherein $A^1$ is a $C_{1-30}$ linking group including an —C(=O)—NR— or —O—C(=O)—NR— moiety, where R is X.

7. The composition of claim 1, wherein L is —CH$_2$—CH$_2$—O—C(=O)— or —O—CF$_2$—CF$_2$—.

8. The composition of claim 1, wherein $A^1$ is t-butyl, 1-ethylcyclopentyl, 1-methylcyclopentyl, 1-ethyl cyclohexyl, 1-methyl cyclohexyl, 2-ethyl-2-adamantyl, 2-methyl-2-adamantanyl, 1-adamantylisopropyl, 2-isopropyl-1-admantanyl, or a combination comprising at least one of the foregoing.

9. The composition of claim 1, wherein the acid-sensitive polymer comprises the residue of a monomer having the formula

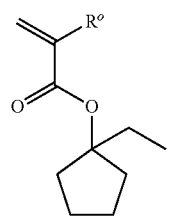

wherein $R^o$ is H, $C_{1-6}$ alkyl, or CF$_3$.

10. The composition of claim 1, further comprising a quencher comprising an amine, an amide, a carbamate, or a combination comprising at least one of the foregoing, a solvent, and optionally an additive comprising an embedded surface active additive, a surfactant, or a combination comprising at least one of the foregoing.

11. A patternable film comprising:
an acid-sensitive polymer, and
a cyclic sulfonium compound having the formula:

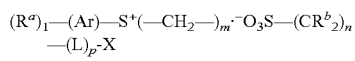

or the formula:

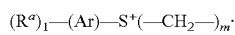

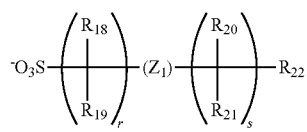

wherein
$R^a$ is a isopropyl, t-butyl, cyclopentyl, or cyclohexyl,
Ar is para-phenylene,
each $R^b$ is independently F or a linear $C_{1-4}$ perfluoroalkyl group,
L is a $C_{1-30}$ linking group including an —C(=O)—NR— or —O—C(=O)—NR— moiety, wherein R is H or X,
X is a substituted or unsubstituted, $C_5$ or greater polycyclic or fused polycyclic cycloaliphatic group, optionally comprising a heteroatom comprising O, S, N, F, or a combination comprising at least one of the foregoing, and
$Z_1$ is —O— or —O—C(=O)—,
$R_{18}$ to $R_{21}$ are independently H, F, $C_{1-10}$ alkyl, or $C_{1-10}$ fluoroalkyl,
$R_{22}$ is norbornyl, cholate, a $C_8$ caged lactone, or a 1- or 2-adamantyl group optionally comprising an —OH, —OCH$_3$, or —OCF$_3$ group,
l is 1, m is 4, n is 2, p is 1, r is 2 to 4, and s is 0 to 4, provided that when $Z_1$ is —O—C(=O)— and s is 0, r is 4,
wherein the acid-sensitive polymer comprises
(i) a structural unit comprising a monocyclic acid-cleavable group protecting a base-soluble group,
(ii) a structural unit comprising a polycyclic acid-cleavable group protecting a base-soluble group,
wherein the structural unit having the monocyclic or polycyclic acid-cleavable protective group is derived from
a monomer having the formula:

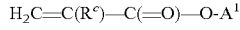

wherein $R^c$ is H, $C_{1-6}$ alkyl, F, or CF$_3$ and $A^1$ is a $C_{4-50}$ tertiary alkyl-containing group in which a tertiary center of $A^1$ is connected to an ester oxygen atom of the monomer, or
a monomer having the formula:

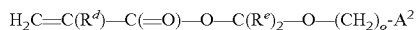

wherein $R^d$ is H, $C_{1-6}$ alkyl, F, or CF$_3$, each $R^e$ is independently H or a $C_{1-4}$ alkyl group, $A^2$ is a $C_{1-30}$ cycloaliphatic group, and o is an integer of 0-4, (iii) a structural unit derived from a lactone monomer, and
(iv) a structural unit derived from a polar monomer comprising a hydrogen donor group.

12. The patternable film of claim 11, wherein the acid-sensitive polymer comprises the residue of a monomer having the formula

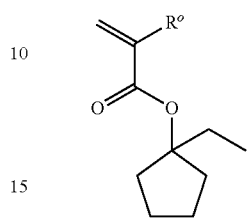

wherein $R^o$ is H, $C_{1-6}$ alkyl, or CF$_3$.

13. A formulation comprising:
an acid-sensitive polymer,
a solvent, and
a cyclic sulfonium compound having the formula:

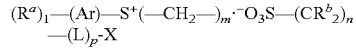

or the formula:

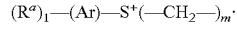

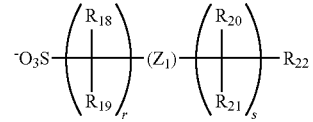

wherein
$R^a$ is isopropyl, t-butyl, cyclopentyl, or cyclohexyl,
Ar is para-phenylene,
each $R^b$ is independently F or a linear $C_{1-4}$ perfluoroalkyl group,
L is a $C_{1-30}$ linking group including an —C(=O)—NR—, or —O—C(=O)—NR— moiety, wherein R is H or X,
X is a substituted or unsubstituted, $C_5$ or greater polycyclic or fused polycyclic cycloaliphatic group, optionally comprising a heteroatom comprising O, S, N, F, or a combination comprising at least one of the foregoing,
$Z_1$ is —O— or —O—C(=O)—,
$R_{18}$ to $R_{21}$ are independently H, F, $C_{1-10}$ alkyl, or $C_{1-10}$ fluoroalkyl,
$R_{22}$ is norbornyl, cholate, a $C_8$ caged lactone, or a 1- or 2-adamantyl group optionally comprising an —OH, —OCH$_3$, or —OCF$_3$ group, and
l is 1, m is 4, n is 2, p is 1, r is 2 to 4, and s is 0 to 4, provided that when $Z_1$ is —O—C(=O)— and s is 0, r is 4,
wherein the acid-sensitive polymer comprises
(i) a structural unit comprising a monocyclic acid-cleavable group protecting a base-soluble group,
(ii) a structural unit comprising a polycyclic acid-cleavable group protecting a base-soluble group,
wherein the structural unit having the monocyclic or polycyclic acid-cleavable protective group is derived from
a monomer having the formula:

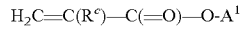

wherein $R^c$ is H, $C_{1-6}$ alkyl, F, or $CF_3$ and $A^1$ is a $C_{4-50}$ tertiary alkyl-containing group in which a tertiary center of $A^1$ is connected to an ester oxygen atom of the monomer, or a monomer having the formula:

$$H_2C\!=\!C(R^d)\!-\!C(\!=\!O)\!-\!O\!-\!C(R^e)_2\!-\!O\!-\!(CH_2)_o\text{-}A^2$$

wherein $R^d$ is H, $C_{1-6}$ alkyl, F, or $CF_3$, each $R^e$ is independently H or a $C_{1-4}$ alkyl group, $A^2$ is a $C_{1-30}$ cycloaliphatic group, and o is an integer of 0-4, (iii) a structural unit derived from a lactone monomer, and (iv) a structural unit derived from a polar monomer comprising a hydrogen donor group.

14. The formulation of claim 13, wherein the acid-sensitive polymer comprises the residue of a monomer having the formula

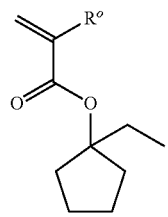

wherein $R^o$ is H, $C_{1-6}$ alkyl, or $CF_3$.

* * * * *